(12) United States Patent
Pyo et al.

(10) Patent No.: US 8,842,483 B2
(45) Date of Patent: Sep. 23, 2014

(54) SEMICONDUCTOR DEVICE AND METHOD OF OPERATING THE SAME

(71) Applicant: Samsung Electronics Co., Ltd., Suwon-si (KR)

(72) Inventors: Mark Pyo, Hwaseong-si (KR); Hyun Taek Jung, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 68 days.

(21) Appl. No.: 13/747,200

(22) Filed: Jan. 22, 2013

(65) Prior Publication Data

US 2013/0265833 A1     Oct. 10, 2013

(30) Foreign Application Priority Data

Apr. 5, 2012    (KR) .................... 10-2012-0035463

(51) Int. Cl.
*G11C 7/00*    (2006.01)

(52) U.S. Cl.
USPC ............. 365/189.07; 365/189.09; 365/203; 365/205

(58) Field of Classification Search
USPC .................. 365/189.07, 189.09, 203, 205
See application file for complete search history.

(56) References Cited

U.S. PATENT DOCUMENTS

| | | | |
|---|---|---|---|
| 6,052,324 A * | 4/2000 | Tobita | 365/207 |
| 6,226,207 B1 | 5/2001 | Suh | |
| 6,373,763 B1 | 4/2002 | Taito et al. | |
| 6,529,437 B2 | 3/2003 | Kono | |
| 6,898,137 B2 | 5/2005 | Arimoto et al. | |
| 7,333,378 B2 | 2/2008 | Sim | |
| 7,447,089 B2 | 11/2008 | Im et al. | |
| 2006/0092730 A1 | 5/2006 | Kang et al. | |
| 2007/0171745 A1* | 7/2007 | Kim et al. | 365/203 |
| 2007/0223289 A1* | 9/2007 | Lee | 365/189.11 |

FOREIGN PATENT DOCUMENTS

| | | |
|---|---|---|
| JP | 2001057079 A | 2/2001 |
| JP | 2008084529 A | 4/2008 |
| KR | 100247219 B1 | 10/1999 |
| KR | 20050021206 A | 3/2005 |

* cited by examiner

*Primary Examiner* — Hoai V Ho
(74) *Attorney, Agent, or Firm* — Muir Patent Consulting, PLLC

(57) ABSTRACT

A semiconductor device and a method of operating the same, the semiconductor device including a sense amplifier connected between a bit line and a complementary bit line; a first power supply circuit configured to select between supplying a power supply voltage to the first node and blocking the power supply voltage from the first node in response to a first control signal; a second power supply circuit configured to select between supplying a ground voltage to the second node and blocking the ground voltage from the second node in response to a second control signal; and a first boosting circuit configured to boost a voltage at the first node in response to a third control signal.

20 Claims, 20 Drawing Sheets

SEMICONDUCTOR DEVICE AND METHOD OF OPERATING THE SAME

CROSS-REFERENCE TO RELATED APPLICATIONS

This application claims priority under 35 U.S.C. §119(a) to Korean Patent Application No. 10-2012-0035463 filed on Apr. 5, 2012, the disclosure of which is hereby incorporated by reference in its entirety.

BACKGROUND

Example embodiments relate to a semiconductor device and a method of operating the same, and more particularly, to a precharge operation for a semiconductor device.

In general, a semiconductor memory device is used as a storage medium of a main memory. Examples of the semiconductor memory device include a read only memory (ROM) and a random access memory (RAM).

ROM is a memory that can only perform a read operation, and although power supply is blocked, data recorded in the ROM is not erased. Examples of the ROM include a mask ROM, a programmable ROM (PROM), and an erasable programmable ROM (EPROM). Data stored in RAM can be changed by a user, and the RAM can store data by a writing operation. When power supply is blocked, data stored in the RAM may be all erased.

Examples of the RAM include a static RAM (SRAM) and a dynamic RAM (DRAM). SRAM retains recorded data while power is supplied, whereas DRAM must be periodically refreshed to retain the stored data. In particular, DRAM operates at a reduced voltage and at a high speed, and consumes less power due to a scaling-down process.

A sense amplifier included in a DRAM may sense the state of a memory cell included in the DRAM and amplify a signal generated according to a result of the sensing. However, in conventional DRAM, when a power supply voltage is low, a sensing margin is reduced, leading to an increase in a sensing duration and a reduction of sensing accuracy.

SUMMARY

According to some embodiments of the present disclosure, there is provided a semiconductor device. The semiconductor device comprises a plurality of memory cells, a sense amplifier, a first power supply circuit, a second power supply circuit, and at least a first boosting circuit. Each of the plurality of memory cells is connected to a bit line or a complementary bit line. The sense amplifier is connected between the bit line and the complementary bit line. The first power supply circuit is positioned between a power supply voltage and a first node of the sense amplifier, and is configured to select between supplying a power supply voltage to the first node and blocking the power supply voltage from the first node in response to a first control signal. The second power supply circuit is positioned between a ground voltage and a second node of the sense amplifier, and is configured to select between supplying a ground voltage to the second node and blocking the ground voltage from the second node in response to a second control signal. The first boosting circuit is configured to, during a precharge operation of the memory cells, boost a voltage at the first node or the second node in response to a third control signal when the power supply voltage is lower than a first predetermined voltage.

According to further embodiments, there is provided a method for a precharge operation of a semiconductor device. The method includes performing an amplifying operation on a bit line of the memory cells by supplying a power supply voltage or a ground voltage to a first node of a sense amplifier, beginning a precharge operation after receiving a precharge command, comparing a power supply voltage with a predetermined voltage and outputting a comparison signal, blocking the power supply voltage or the ground voltage from the first node in response to the comparison result indicating the power supply voltage is lower than the predetermined voltage, and boosting a voltage of the first node by using a first capacitor.

According to other embodiments, there is provided another method for a precharge operation of a semiconductor device including a bit line sense amplifier between a bit line and a complementary bit line coupled to a plurality of memory cells. The method includes supplying a first power voltage to a sensing line of the bit line sense amplifier, supplying a second power voltage to a complementary sensing line of the bit line sense amplifier, beginning a precharge operation after receiving a precharge command, comparing the first power supply voltage with a first predetermined voltage, and boosting the sensing line or the complementary sensing line when the first power voltage is lower than the first predetermined voltage.

BRIEF DESCRIPTION OF THE DRAWINGS

Exemplary embodiments will be more clearly understood from the following detailed description taken in conjunction with the accompanying drawings of which.

DETAILED DESCRIPTION OF THE EMBODIMENTS

Figure 1:
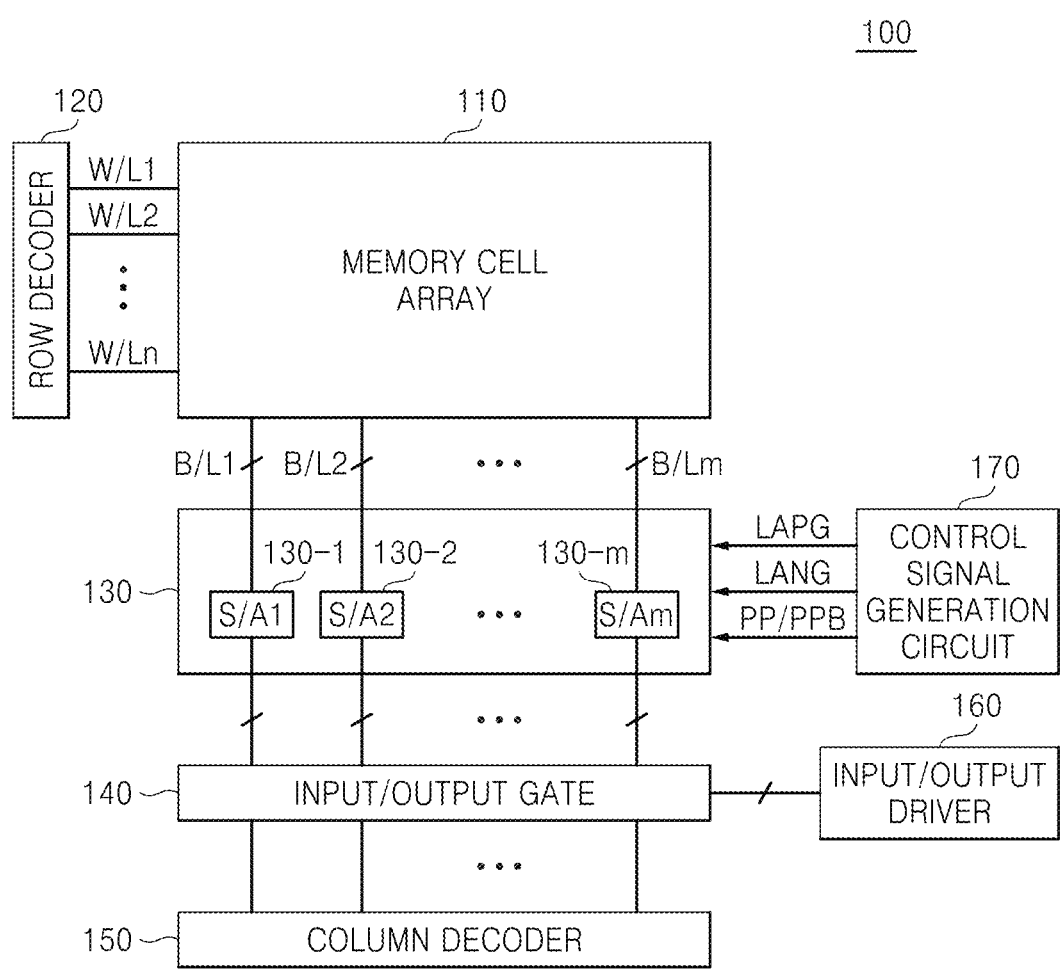
FIG. 1 is a block diagram of a semiconductor device according to one embodiment.

Various example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. Unless indicated otherwise, these terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present disclosure, and will not be interpreted in an idealized or overly formal sense unless expressly so defined herein.

Example embodiments relate to a semiconductor device and a method of operating the same, and more particularly, to a semiconductor device capable of fast and stably read data from a memory cell by increasing a difference between levels of a bit line and a complementary bit line during a precharge operation when a power supply voltage is low, and a method of operating the semiconductor device.

FIG. 1 is a block diagram of a semiconductor device 100 according to one embodiment. Referring to FIG. 1, the semiconductor device 100 includes a memory cell array 110, a row decoder 120, a sense amplifier block 130, an input/output gate 140, a column decoder 150, an input/output driver 160, and a control signal generation circuit 170.

The memory cell array 110 includes a plurality of word lines W/L1 through W/Ln where n denotes a natural number, a plurality of bit lines B/L1 through B/Lm where m denotes a natural number, and a plurality of memory cells for storing data. Each of the bit lines B/L1 through B/Lm includes a bit line and a complementary bit line.

The row decoder 120 decodes a row address and selects one from the word lines W/L1 through W/Ln according to a result of the decoding. The sense amplifier block 130 includes a plurality of sense amplifiers 130-1 through 130-$m$ each that sense and amplify a voltage difference between a bit line and its a complementary bit line in response to at least one of a plurality of control signals LAPG, LANG, and PP/PPB output from the control signal generation circuit 170. For example, the sense amplifier block 130 further includes a plurality of write drivers (not shown) that transmit write data to the bit lines B/L1 through B/Lm, respectively, in addition to the sense amplifiers 130-1 through 130-$m$.

The column decoder 150 decodes a column address and generates a plurality of column selection signals according to a result of the decoding. The input/output gate 140 connects the sense amplifier block 130 to the input/output driver 160 according to the column selection signals output from the column decoder 150.

During a write operation, the input/output gate 140 transmits write data output from the input/output driver 160 to the sense amplifier block 130 according to the column selection signals output from the column decoder 150. During a read operation, the input/output gate 140 transmits a plurality of sensed and amplified signals output from the sense amplifier block 130 to the input/output driver 160 according to the column selection signals output from the column decoder 150.

While the semiconductor device 100 is performing a read operation or a write operation, the control signal generation circuit 170 generates at least one of the first through fourth control signals LAPG, LANG, PP, and PPB for controlling an operation of each of the sense amplifiers 130-1 through 130-*m* included in the sense amplifier block 130.

Figure 2:
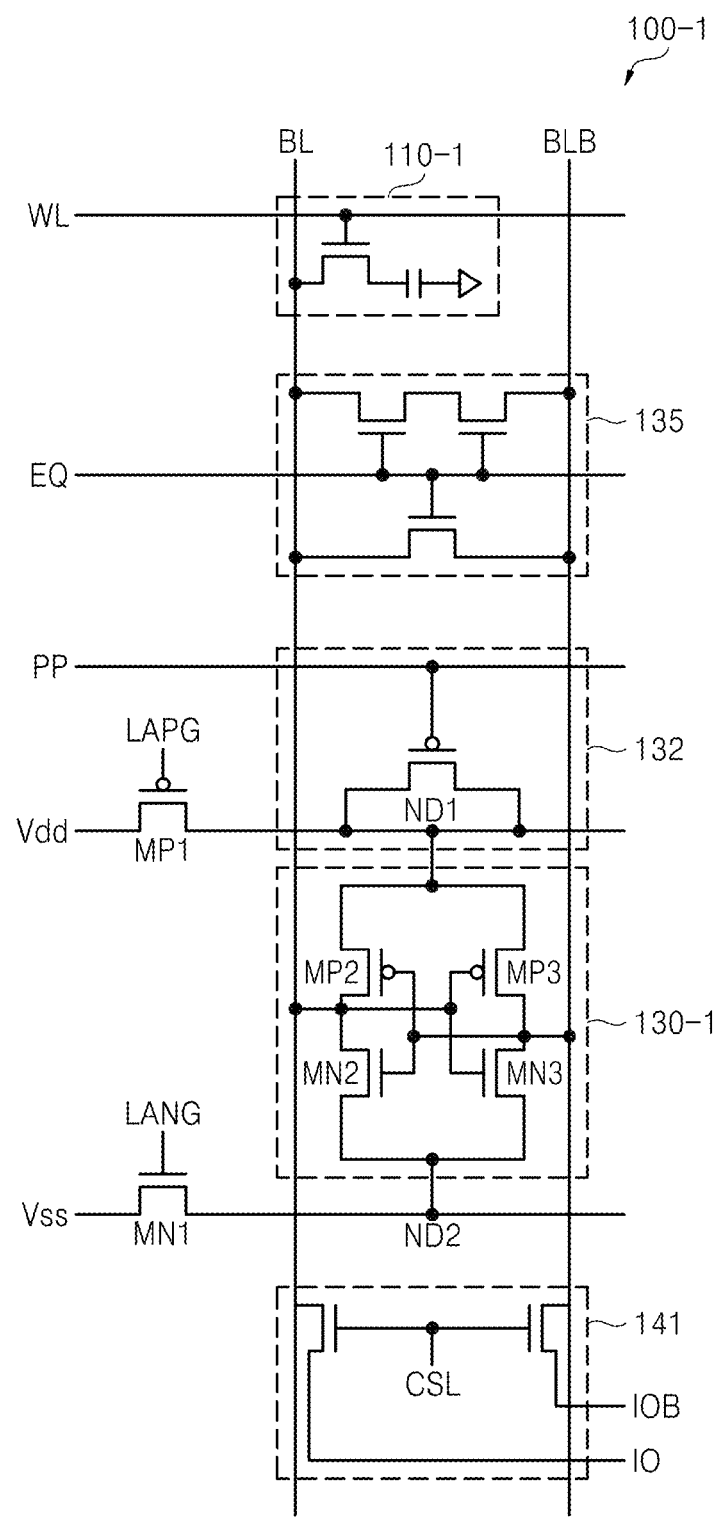
FIG. 2 is a circuit diagram of a part of the semiconductor device illustrated in FIG. 1, according to one embodiment.

FIG. 2 is a circuit diagram of a part of the semiconductor device 100 of FIG. 1, according to one embodiment. The part of the semiconductor device 100 is hereinafter referred to as a semiconductor device 100-1. For convenience of explanation, FIG. 2 illustrates a memory cell 110-1 from among a plurality of memory cells included in the memory cell array 110, the sense amplifier 130-1 from among the sense amplifiers 130-1 through 130-*m*, and a part 141 of the input/output gate 140.

Referring to FIGS. 1 and 2, the semiconductor device 100-1 includes the memory cell 110-1, the sense amplifier 130-1, a first power supply circuit MP1, a second power supply circuit MN1, a first boosting circuit 132, an equalization circuit 135, and the part 141 of the input/output gate 140.

The memory cell 110-1 may be connected to a bit line BL and a word line WL, and may store data in a capacitor included in the memory cell 110-1.

The sense amplifier 130-1 is connected between the bit line BL and a complementary bit line BLB and senses and amplifies a voltage difference between the bit line BL and the complementary bit line BLB. The sense amplifier 130-1 may include PMOS transistors MP2 and MP3 and NMOS transistors MN2 and MN3. The PMOS transistors MP2 and MP3 may be connected in series between the bit line BL and the complementary bit line BLB, a gate of the PMOS transistor MP2 may be connected to the complementary bit line BLB, and a gate of the PMOS transistor MP3 may be connected to the bit line BL.

The NMOS transistors MN2 and MN3 may be connected in series between the bit line BL and the complementary bit line BLB, a gate of the NMOS transistor MN2 may be connected to the complementary bit line BLB, and a gate of the NMOS transistor MN3 may be connected to the bit line BL.

The first power supply circuit MP1 supplies a power supply voltage Vdd to a first node ND1 in response to the first control signal LAPG. For example, the first power supply circuit MP1 may be implemented by using a PMOS transistor including a control terminal, for example, a gate, that receives the first control signal LPAG. The first power supply circuit MP1 may block the power supply voltage Vdd from the first node ND1 in response to the first control signal LAPG.

The second power supply circuit MN1 supplies a ground voltage Vss to a second node ND2 in response to the second control signal LANG. For example, the second power supply circuit MN1 may be implemented by using an NMOS transistor including a control terminal, for example, a gate, that receives the second control signal LANG.

Figure 4:
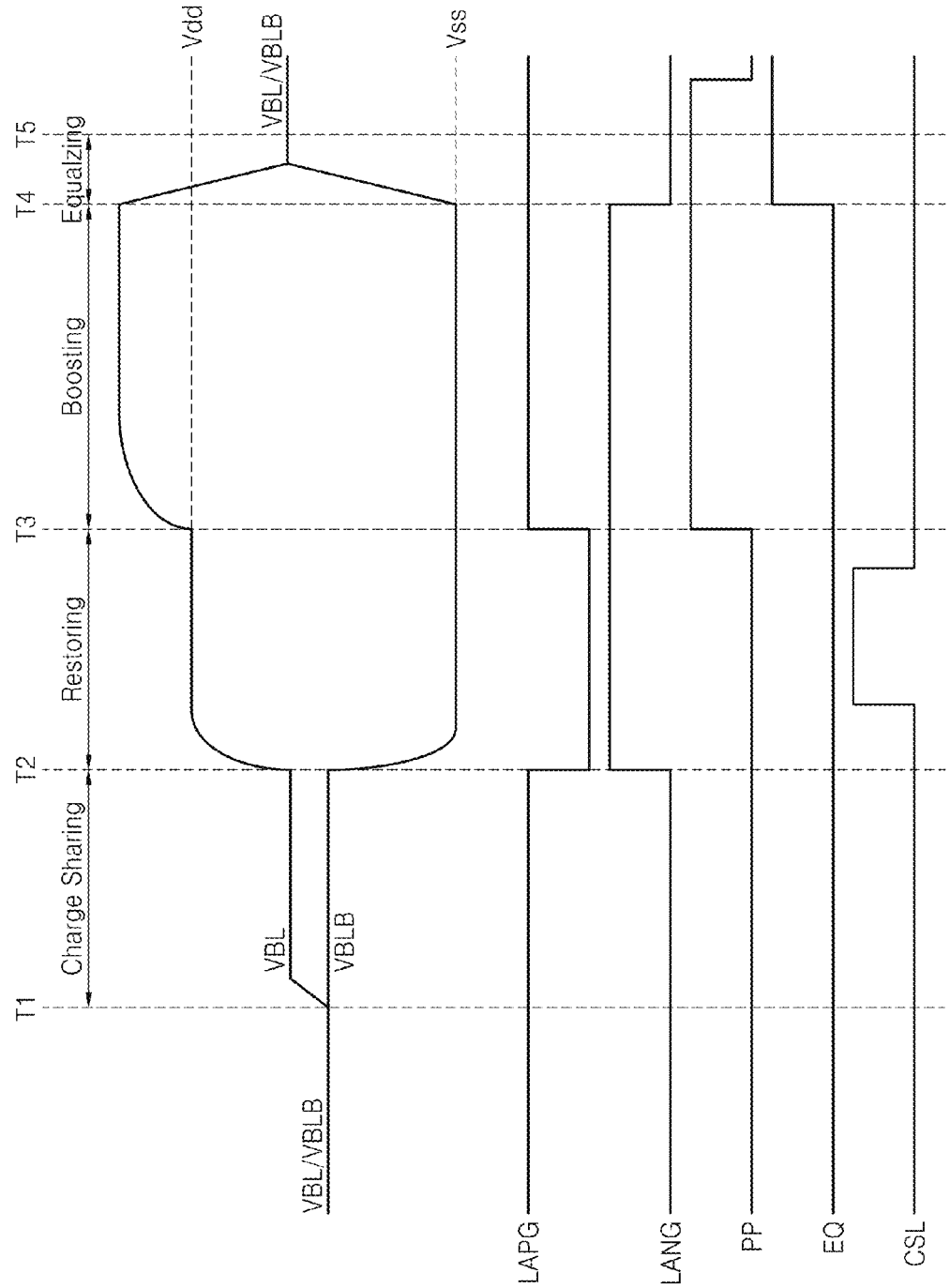
FIG. 4 is a timing diagram for explaining an operation of the part of the semiconductor device illustrated in FIG. 2 according to one embodiment.
Figure 7:
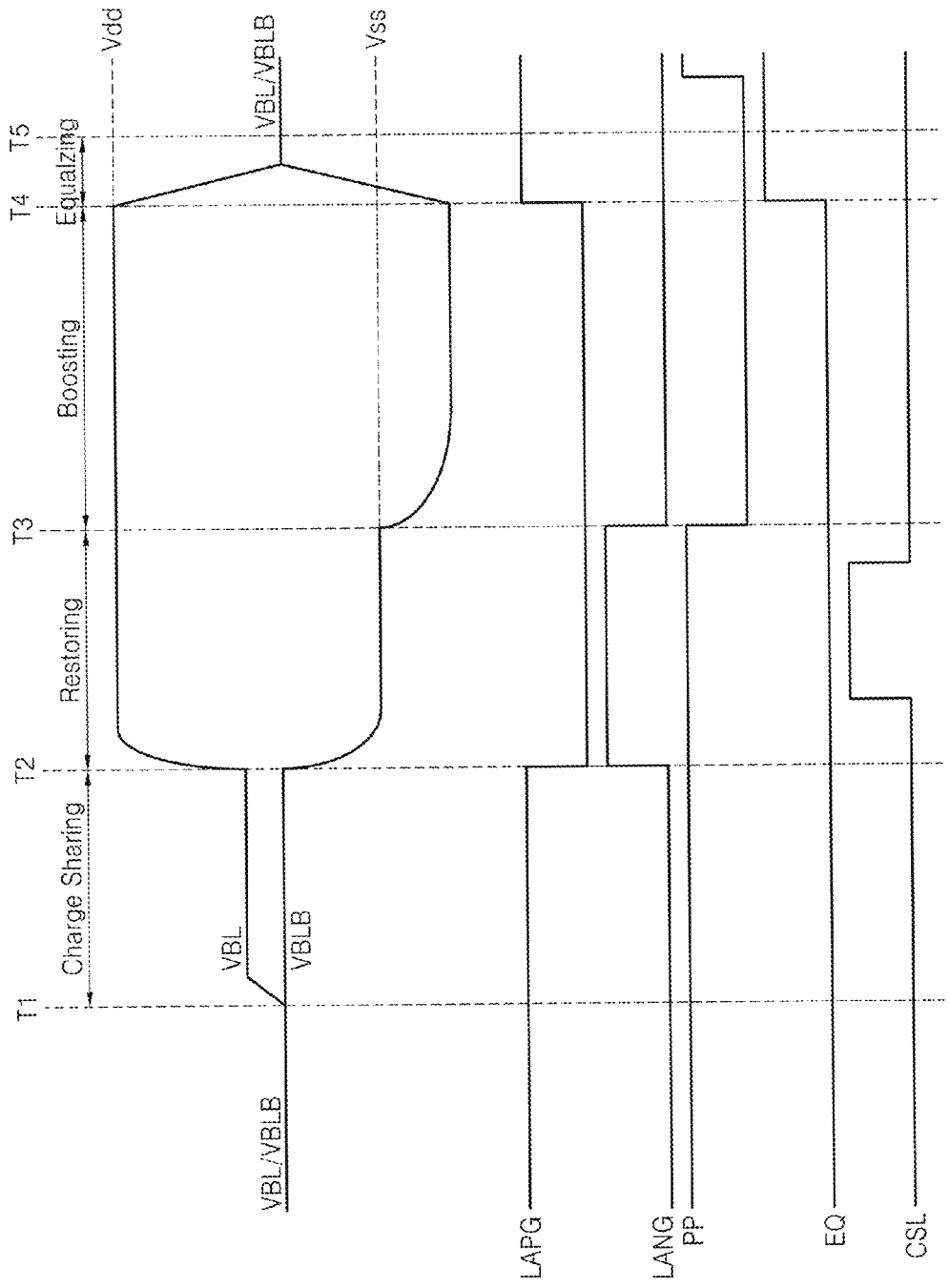
FIG. 7 is a timing diagram for explaining an operation of the part of the semiconductor device illustrated in FIG. 5 according to one embodiment.

The first boosting circuit 132 boosts a voltage of the first node ND1 in response to the third control signal PP. For example, boost may refer to increasing a positive voltage. Boost may also refer to decreasing a voltage. For example, FIG. 4 shows a boost in VBL at time T3. As another example, FIG. 7 shows a boost in VBLB at time T3. In some cases, the first boosting circuit 132 may be implemented by using a capacitor including a control terminal that receives the third control signal PP. In other words, the first boosting circuit 132 may boost a voltage of the first node ND1 by using coupling of the capacitor that occurs in response to the third control signal PP. For example, the first boosting circuit 132 may be implemented by using a MOS transistor that includes a gate via which the third control signal PP is received and a source and a drain connected to the first node ND1.

The equalization circuit 135 may equalize the bit line BL and the complementary bit line BLB in response to an equalization control signal EQ. The part 141 of the input/output gate 140 may output a signal of the bit line BL and a signal of the complementary bit line BLB as a pair of input/output lines IO and IOB, in response to a column selection signal CSL.

Figure 3:
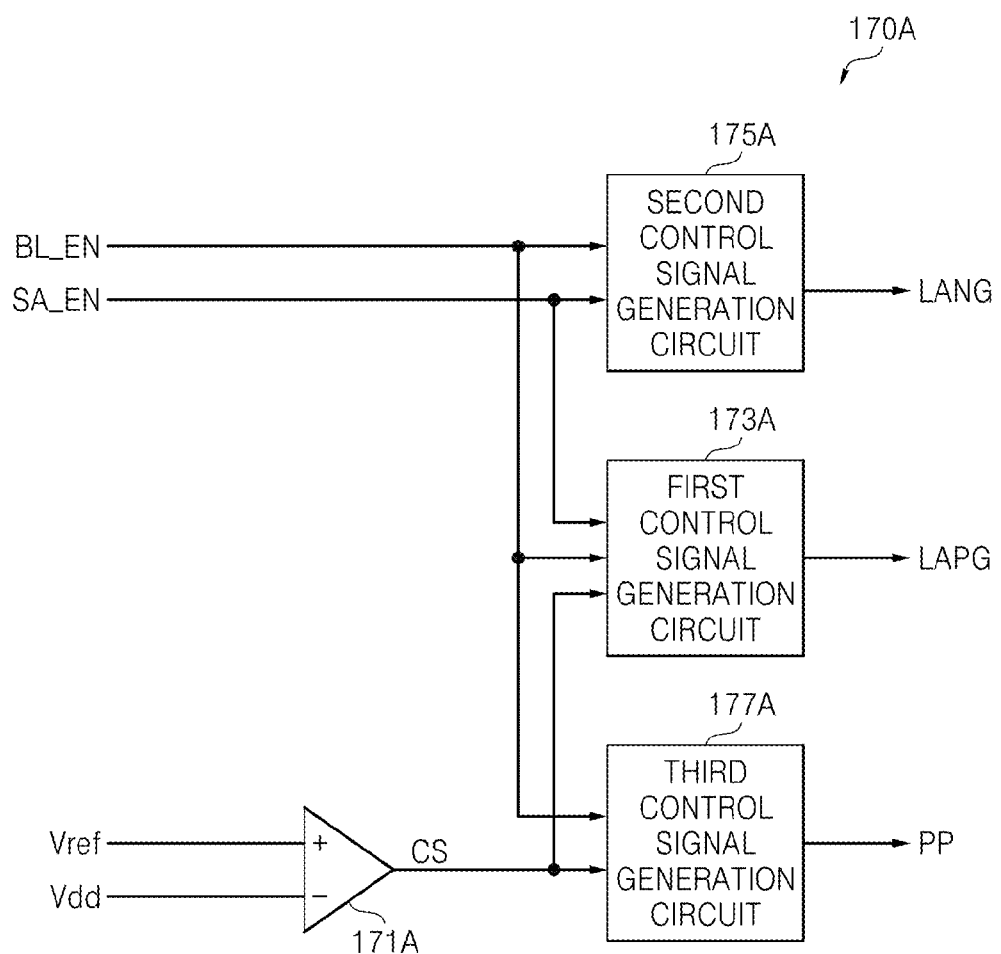
FIG. 3 is a block diagram of an embodiment of a control signal generation circuit illustrated in FIG. 1 according to one embodiment.

FIG. 3 is a block diagram of a control signal generation circuit 170A which is an embodiment of the control signal generation circuit 170 illustrated in FIG. 1, and FIG. 4 is a timing diagram for explaining an operation of the semiconductor device 110-1 illustrated in FIG. 2 according to one embodiment. Referring to FIGS. 1 through 4, the control signal generation circuit 170A may include a comparison circuit 171A, a first control signal generation circuit 173A, a second control signal generation circuit 175A, and a third control signal generation circuit 177A.

The comparison circuit 171A may compare the power supply voltage Vdd with a reference voltage Vref and output a comparison signal CS according to a result of the comparison. In some cases, the comparison circuit 171A may compare the power supply voltage Vdd with the reference voltage Vref in response to a precharge command received from an external source, and may output the comparison signal CS according to a result of the comparison. For example, the comparison circuit 171A may receive the precharge command, compare the power supply voltage Vdd with the reference voltage Vref after the lapse of a predetermined period of time, and output the comparison signal CS according to a result of the comparison.

The first control signal generation circuit 173A may output the first control signal LAPG based on a block enable signal BL_EN, a sense amplifier enable signal SA_EN, and the comparison signal CS output from the comparison circuit 171A.

The block enable signal BL_EN enables a block including the memory cell 110-1. In other words, the block enable signal BL_EN may denote information that represents an address of a memory block connected to a plurality of sense amplifiers from among the memory cells included in the memory cell array 110.

The sense amplifier enable signal SA_EN is activated after an active command received from an external source is activated, and enables the sense amplifier 130-1. Accordingly, the first control signal generation circuit 173A may control the first power supply circuit MP1 to supply the power supply voltage Vdd to the first node ND1 or block the power supply voltage Vdd from entering the first node ND1, based on the comparison signal CS during a precharge operation. For example, when the power supply voltage Vdd is higher than the reference voltage Vref, the first control signal generation circuit 173A may output a first control signal LAPG for supplying the power supply voltage Vdd to the first node ND1 during a precharge operation.

Herein, a precharge operation (or a precharge phase) denotes an operation of amplifying a voltage difference between the bit line BL and the complementary bit line BLB before a read operation or a write operation for next cell is performed.

Alternatively, when the power supply voltage Vdd is lower than the reference voltage Vref, the first control signal generation circuit 173A may output a first control signal LAPG for blocking the power supply voltage Vdd from the first node ND1.

As shown in FIG. 4, when the power supply voltage Vdd is lower than the reference voltage Vref, the first control signal LAPG is activated, for example, is at low level, from a point of time T2 to a point of time T3. Accordingly, the first power supply circuit MP1 supplies the power supply voltage Vdd to the first node ND1 from the point of time T2 to the point of time T3 and blocks the power supply voltage Vdd from entering the first node ND1 at the point of time T3, in response to the first control signal LAPG.

The second control signal generation circuit 175A may output the second control signal LANG based on the block enable signal BL_EN and the sense amplifier enable signal SA_EN. The second control signal generation circuit 175A may output a second control signal LANG for supplying the ground voltage Vss to the second node ND2 during a precharge operation.

As shown in FIG. 4, the second control signal LANG is activated, for example, is at high level, from the point of time T2 to a point of time T4 according to the block enable signal BL_EN and the sense amplifier enable signal SA_EN. Accordingly, the second power supply circuit MN1 supplies the ground voltage Vss to the second node ND2 from the point of time T2 to the point of time T4 in response to the second control signal LANG.

The third control signal generation circuit 177A may output the third control signal PP based on the block enable signal BL_EN and the comparison signal CS. For example, when the power supply voltage Vdd is lower than the reference voltage Vref, the third control signal generation circuit 177A may output the third control signal PP to the first boosting circuit 132 so that the first boosting circuit 132 boosts a voltage of the first node ND1.

As shown in FIG. 4, when the power supply voltage Vdd is lower than the reference voltage Vref, the third control signal PP is activated, for example, is at high level, from the point of time T3. Accordingly, the first boosting circuit 132 boosts a voltage of the first node ND1 from the point of time T3 in response to the third control signal PP.

The equalization circuit 135 equalizes the bit line BL and the complementary bit line BLB from the point of time T4 to a point of time T5. As shown in FIG. 4, when the power supply voltage Vdd is lower than the reference voltage Vref, a voltage level VBL of the bit line BL equalized after boosting and a voltage level VBLB of the complementary bit line BLB equalized after boosting may be each at least Vdd/2. When the equalization circuit 135 begins to equalize the selected word line may be disabled.

The part 141 of the input/output gate 140 may output the signal of the bit line BL and the signal of the complementary bit line BLB as the pair of input/output lines IO and IOB, in response to the column selection signal CSL received between the points of time T3 and T4.

Figure 5:
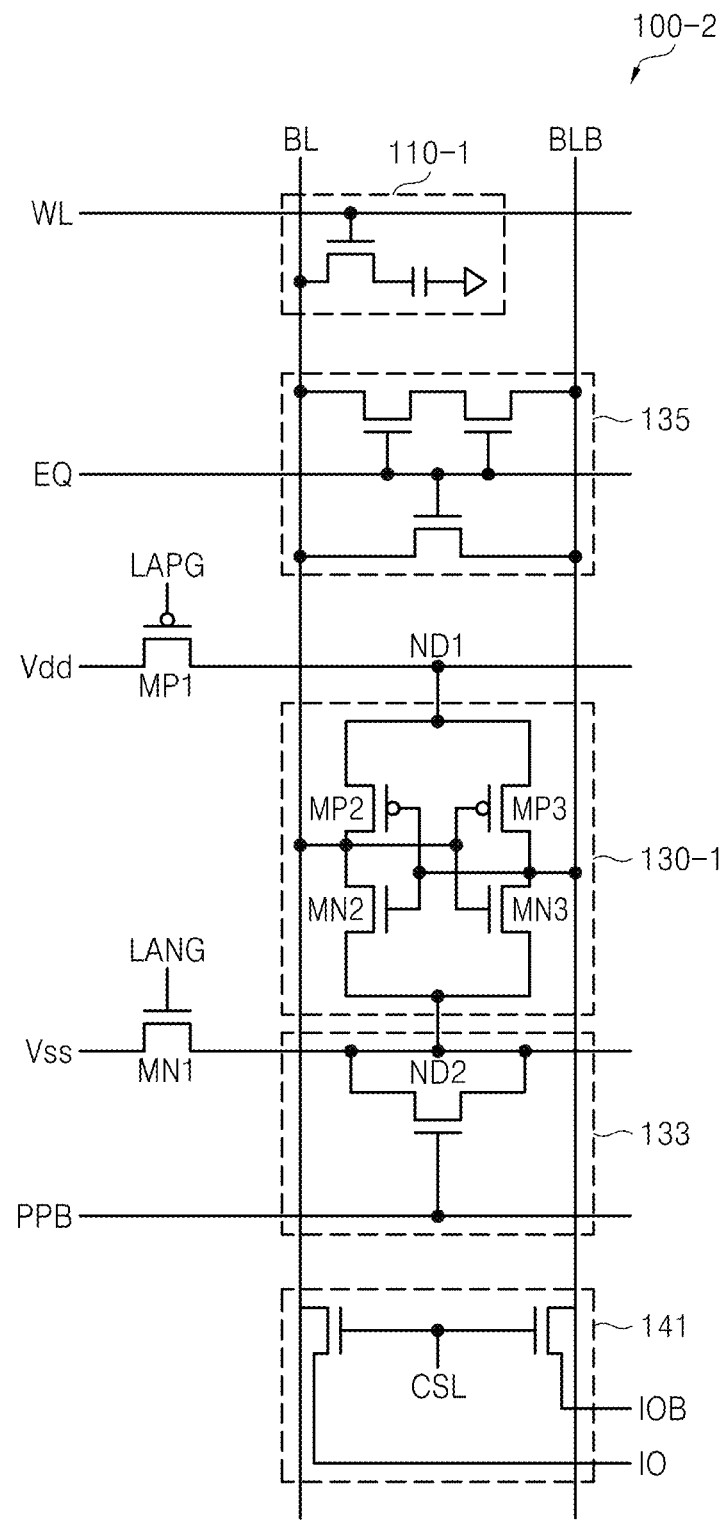
FIG. 5 is a circuit diagram of a part of the semiconductor device illustrated in FIG. 1, according to another embodiment.

FIG. 5 is a circuit diagram of a part of the semiconductor device 100 of FIG. 1, according to another embodiment. The part of the semiconductor device 100 is hereinafter referred to as a semiconductor device 100-2. For convenience of explanation, FIG. 5 illustrates the memory cell 110-1 from among the memory cells included in the memory cell array 110, the sense amplifier 130-1 from among the sense amplifiers 130-1 through 130-m, and the part 141 of the input/output gate 140.

Referring to FIGS. 1 and 5, the semiconductor device 100-2 includes a memory cell 110-1, the sense amplifier 130-1, a first power supply circuit MP1, a second power supply circuit MN1, a second boosting circuit 133, an equalization circuit 135, and a part 141 of the input/output gate 140.

Since the structure and operation of the semiconductor device 100-2 is the same as those of the semiconductor device 100-1 of FIG. 2 except that the semiconductor device 100-2 includes the second boosting circuit 133 instead of the first boosting circuit 132, a detailed description thereof will be omitted.

The first power supply circuit MP1 supplies a power supply voltage Vdd to a first node ND1 in response to a first control signal LAPG. The second power supply circuit MN1 may supply a ground voltage Vss to a second node ND2, and may block the ground voltage Vss from the second node ND2 in response to a second control signal LANG.

The second boosting circuit 133 boosts the second node ND2 in response to the fourth control signal PPB. In some cases, the second boosting circuit 133 may be implemented by using a capacitor including a control terminal that receives the fourth control signal PPB. In other words, the second boosting circuit 133 may boost the second node ND2 by using coupling of the capacitor that occurs in response to the fourth control signal PPB. For example, the second boosting circuit 133 may be implemented by using a MOS transistor that includes a gate via which the fourth control signal PPB is received and a source and a drain connected to the second node ND2.

Figure 6:
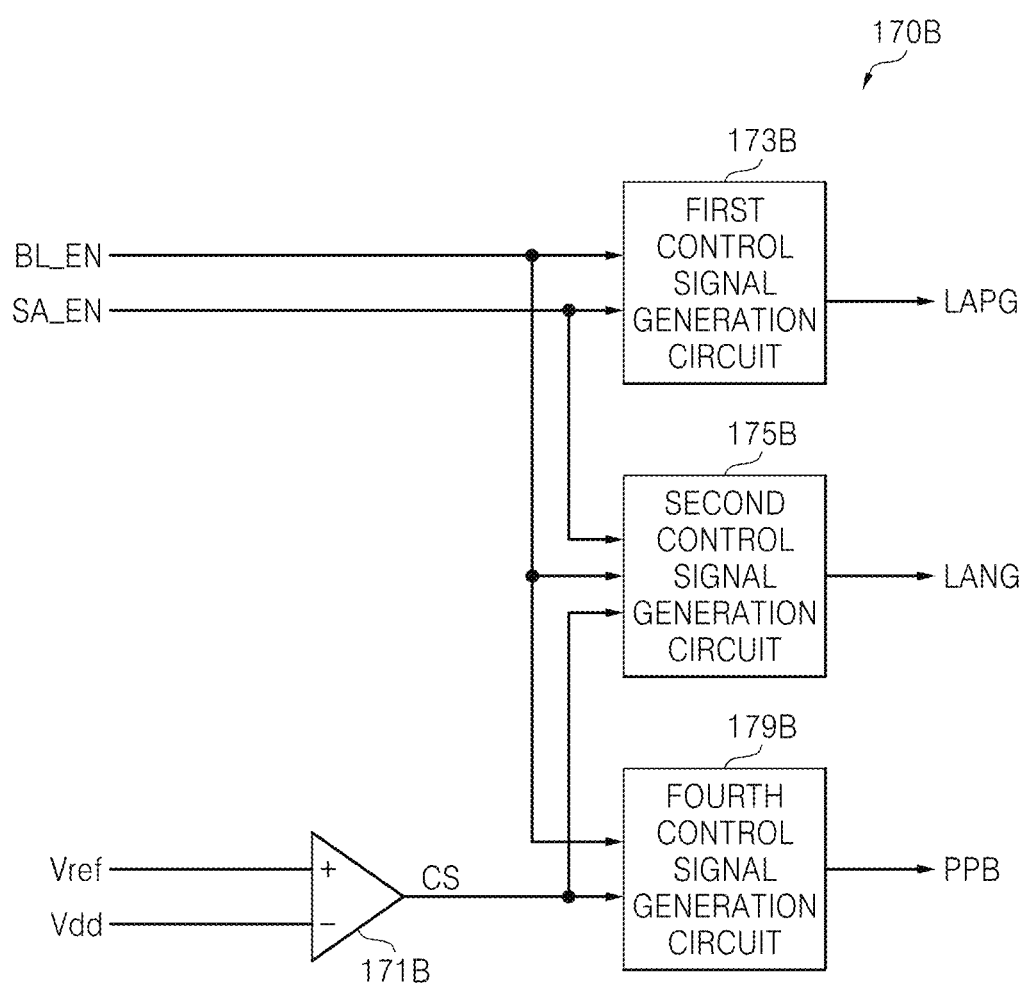
FIG. 6 is a block diagram of another embodiment of the control signal generation circuit illustrated in FIG. 1 according to one embodiment.

FIG. 6 is a block diagram of a control signal generation circuit 170B which is another embodiment of the control signal generation circuit 170 of FIG. 1 according to one embodiment, and FIG. 7 is a timing diagram for explaining an operation of the semiconductor device 100-2 illustrated in FIG. 5 according to one embodiment. Referring to FIGS. 1 and 5 through 7, the control signal generation circuit 170B may include a comparison circuit 171B, a first control signal generation circuit 173B, a second control signal generation circuit 175B, and a fourth control signal generation circuit 179B.

Since a structure and an operation of the comparison circuit 171B of FIG. 6 are the same as those of the comparison circuit 171A of FIG. 3, a detailed description thereof will now be omitted.

The first control signal generation circuit 173B may output the first control signal LAPG based on a block enable signal BL_EN and a sense amplifier enable signal SA_EN. The first control signal generation circuit 173B may output a first control signal LAPG for supplying the power supply voltage Vdd to the first node ND1 during a precharge operation.

As shown in FIG. 7, the first control signal LAPG is activated, for example, is at low level, from a point of time T2 to a point of time T4 according to the block enable signal BL_EN and the sense amplifier enable signal SA_EN. Accordingly, the first power supply circuit MP1 supplies the power supply voltage Vdd to the first node ND1 from the point of time T2 to the point of time T4 in response to the first control signal LAPG.

The second control signal generation circuit 175B may output the second control signal LANG based on the block enable signal BL_EN, the sense amplifier enable signal SA_EN, and a comparison signal CS output from the comparison circuit 171B. Accordingly, the second control signal generation circuit 175B may control the second power supply circuit MN1 supply the ground voltage Vss to the second node ND2 or block the ground voltage Vss from entering the second node ND2, based on the comparison signal CS during a precharge operation.

For example, when the power supply voltage Vdd is higher than a reference voltage Vref, the second control signal generation circuit 175B may output a second control signal LANG for supplying the ground voltage Vss to the second node ND2 during a precharge operation. Alternatively, when the power supply voltage Vdd is lower than the reference voltage Vref, the second control signal generation circuit 175B may output a second control signal LANG for blocking the ground voltage Vss from entering the second node ND2.

As shown in FIG. 7, when the power supply voltage Vdd is lower than the reference voltage Vref, the second control signal LANG is activated, for example, is at high level, from the point of time T2 to a point of time T3. Accordingly, the second power supply circuit MN1 supplies the ground voltage Vss to the second node ND2 from the point of time T2 to the point of time T3 and blocks the ground voltage Vss from entering the second node ND2 at the point of time T3, in response to the second control signal LANG. In other words, the second node ND2 is blocked from the ground voltage Vss at the point of time T3.

The fourth control signal generation circuit 179B may output the fourth control signal PPB based on the block enable signal BL_EN and the comparison signal CS. For example, when the power supply voltage Vdd is lower than the reference voltage Vref, the fourth control signal generation circuit 179B may output the fourth control signal PPB to the second boosting circuit 133 so that the second boosting circuit 133 boosts a voltage of the second node ND2 at the point of time T3.

As shown in FIG. 7, when the power supply voltage Vdd is lower than the reference voltage Vref, the fourth control signal PPB is activated, for example, is at low level, from the point of time T3. Accordingly, the second boosting circuit 133 boosts the second node ND2 from the point of time T3 in response to the fourth control signal PPB.

Figure 8:
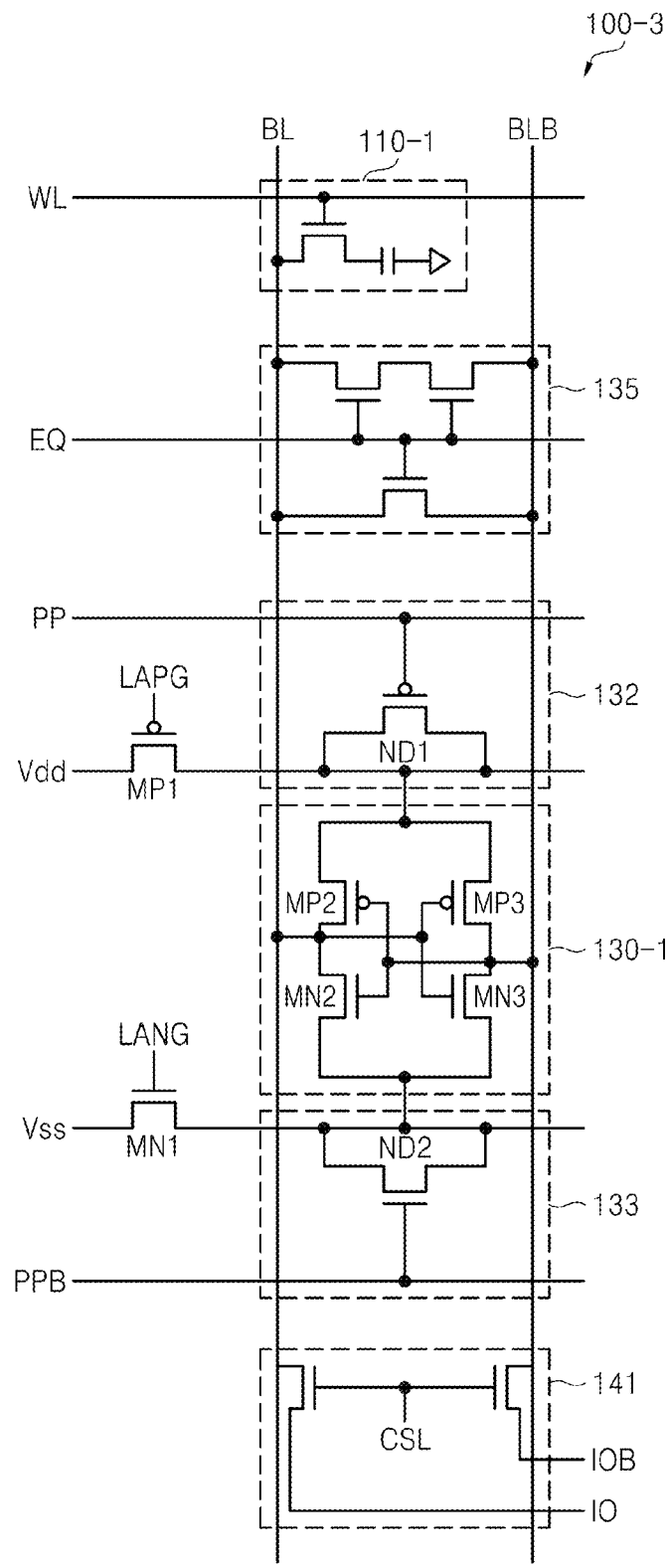
FIG. 8 is a circuit diagram of a part of the semiconductor device illustrated in FIG. 1, according to another embodiment.

FIG. 8 is a circuit diagram of a part of the semiconductor device 100 illustrated in FIG. 1, according to another embodiment. The part of the semiconductor device 100 is hereinafter referred to as a semiconductor device 100-3. For convenience of explanation, FIG. 8 illustrates a memory cell 110-1 from among the memory cells included in the memory cell array 110, the sense amplifier 130-1 from among the sense amplifiers 130-1 through 130-m, and a part 141 of the input/output gate 140.

Referring to FIGS. 1 and 8, the semiconductor device 100-3 includes the memory cell 110-1, the sense amplifier 130-1, a first power supply circuit MP1, a second power supply circuit MN1, a first boosting circuit 132, a second boosting circuit 133, an equalization circuit 135, and the part 141 of the input/output gate 140.

Since the structure and operation of the semiconductor device 100-3 is the same as those of the semiconductor devices 100-1 and 100-2 of FIGS. 2 and 5 except that the semiconductor device 100-3 includes both the first and second boosting circuits 132 and 133, a detailed description thereof will be omitted.

The first power supply circuit MP1 may supply a power supply voltage Vdd to a first node ND1, and may block the power supply voltage Vdd from the first node ND1 in response to a first control signal LAPG.

The second power supply circuit MN1 may supply a ground voltage Vss to a second node ND2, and may float the second node ND2 by blocking supply of the ground voltage Vss to the second node ND2, in response to a second control signal LANG.

The first boosting circuit 132 may boost the first node ND1 in response to the third control signal PP, and the second boosting circuit 133 may boost the second node ND2 in response to the fourth control signal PPB.

Figure 9:
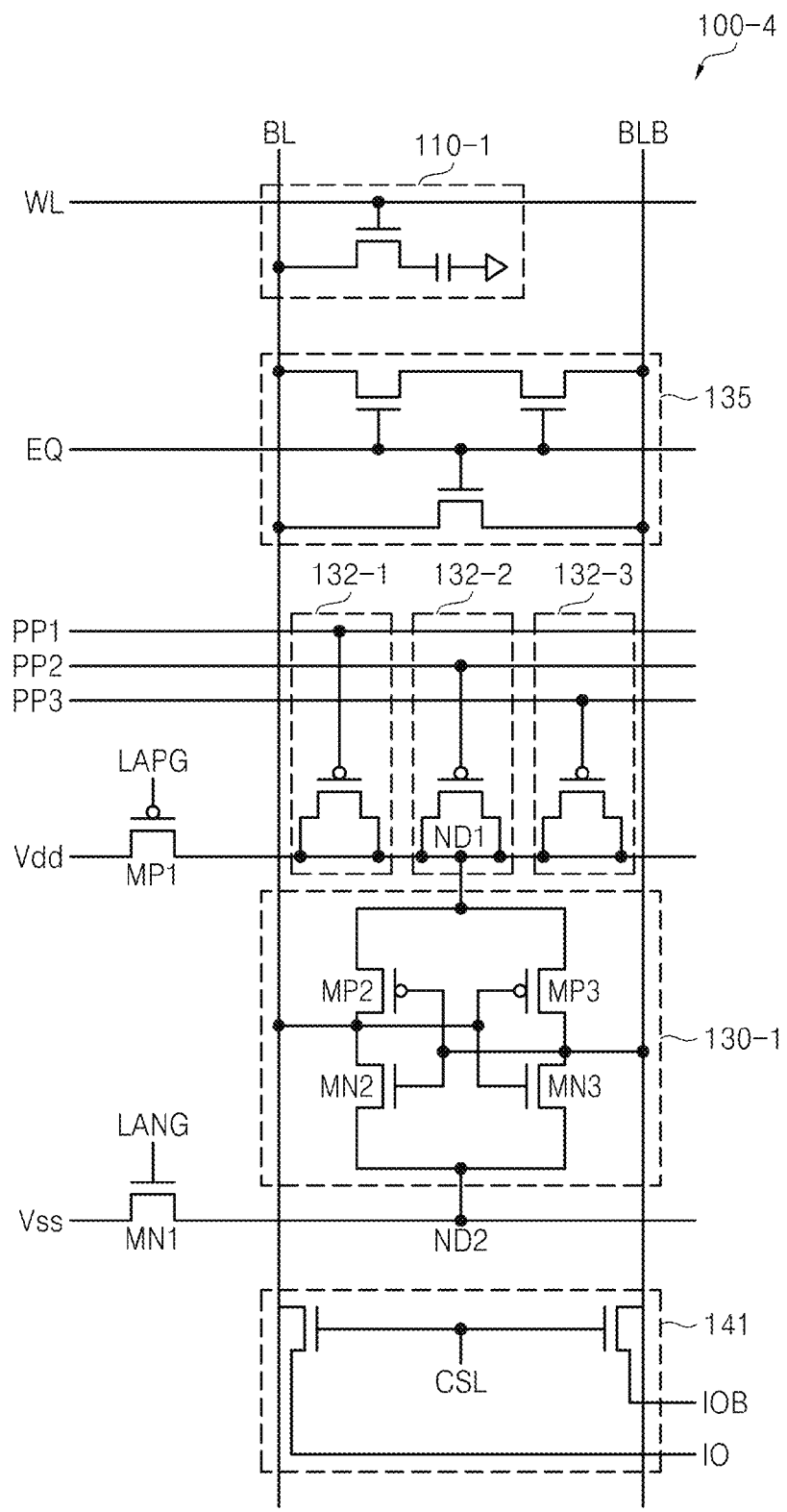
FIG. 9 is a circuit diagram of a part of the semiconductor device illustrated in FIG. 1, according to another embodiment.

FIG. 9 is a circuit diagram of a part of the semiconductor device 100 illustrated in FIG. 1, according to another embodiment. The part of the semiconductor device 100 is hereinafter referred to as a semiconductor device 100-4. For convenience of explanation, FIG. 9 illustrates a memory cell 110-1 from among the memory cells included in the memory cell array 110, the sense amplifier 130-1 from among the sense amplifiers 130-1 through 130-m, and a part 141 of the input/output gate 140.

Referring to FIGS. 1 and 9, the semiconductor device 100-4 includes the memory cell 110-1, the sense amplifier 130-1, a first power supply circuit MP1, a second power supply circuit MN1, a plurality of first boosting circuits 132-1 through 132-3, an equalization circuit 135, and the part 141 of the input/output gate 140.

Since the structure and operation of the semiconductor device 100-4 is the same as those of the semiconductor device 100-1 of FIG. 2 except that the semiconductor device 100-4 includes the first boosting circuits 132-1 through 132-3, a detailed description thereof will be omitted.

Although the three first boosting circuits 132-1 through 132-3 are illustrated in FIG. 9 for convenience of explanation, the number of first boosting circuits is not limited thereto.

The first boosting circuits 132-1 through 132-3 may boost a first node ND1 in response to a plurality of third control signals PP1 through PP3, respectively.

In some cases, each of the third control signals PP1 through PP3 may be a signal generated according to the magnitude of a power supply voltage Vdd. Accordingly, the first boosting circuits 132-1 through 132-3 may boost the first node ND1 based on the magnitude of the power supply voltage Vdd.

Figure 10:
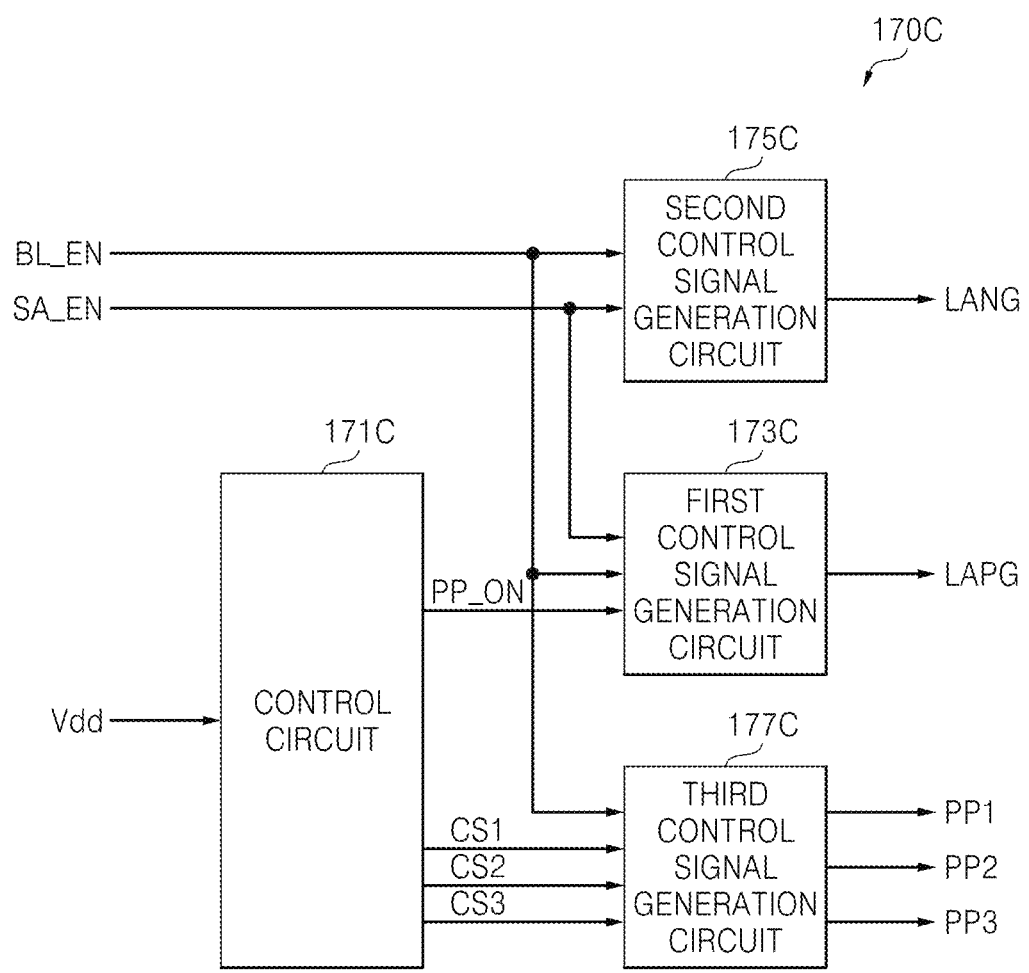
FIG. 10 is a block diagram of another embodiment of the control signal generation circuit illustrated in FIG. 1 according to one embodiment.

FIG. 10 is a block diagram of a control signal generation circuit 170C which is another embodiment of the control signal generation circuit 170 illustrated in FIG. 1. Referring to FIGS. 1, 9, and 10, the control signal generation circuit 170C includes a control circuit 171C, a first control signal generation circuit 173C, a second control signal generation circuit 175C, and a third control signal generation circuit 177C.

Referring back to FIG. 10, the control circuit 171C may compare the power supply voltage Vdd with a plurality of reference voltages having different magnitudes and output a plurality of comparison signals CS1 through CS3 according to a result of the comparison. The control circuit 171C may output a boosting enable signal PP_ON based on the comparison signals CS1 through CS3. When at least one of the comparison signals CS1 through CS3 is activated, the control circuit 171C may activate the boosting enable signal PP_ON.

The second control signal generation circuit 175C may output a second control signal LANG based on the block enable signal BL_EN and the sense amplifier enable signal SA_EN. The second control signal generation circuit 175C may output a second control signal LANG for supplying the ground voltage Vss to the second node ND2 during a pre-charge operation.

The third control signal generation circuit 177C may output the third control signals PP1 through PP3 based on the block enable signal BL_EN and the comparison signals CS1 through CS3 output from the control circuit 171C. At this time, the first boosting circuits 132-1 through 132-3 may boost the first node ND1 in response to the third control signals PP1 through PP3, respectively.

Figure 11:
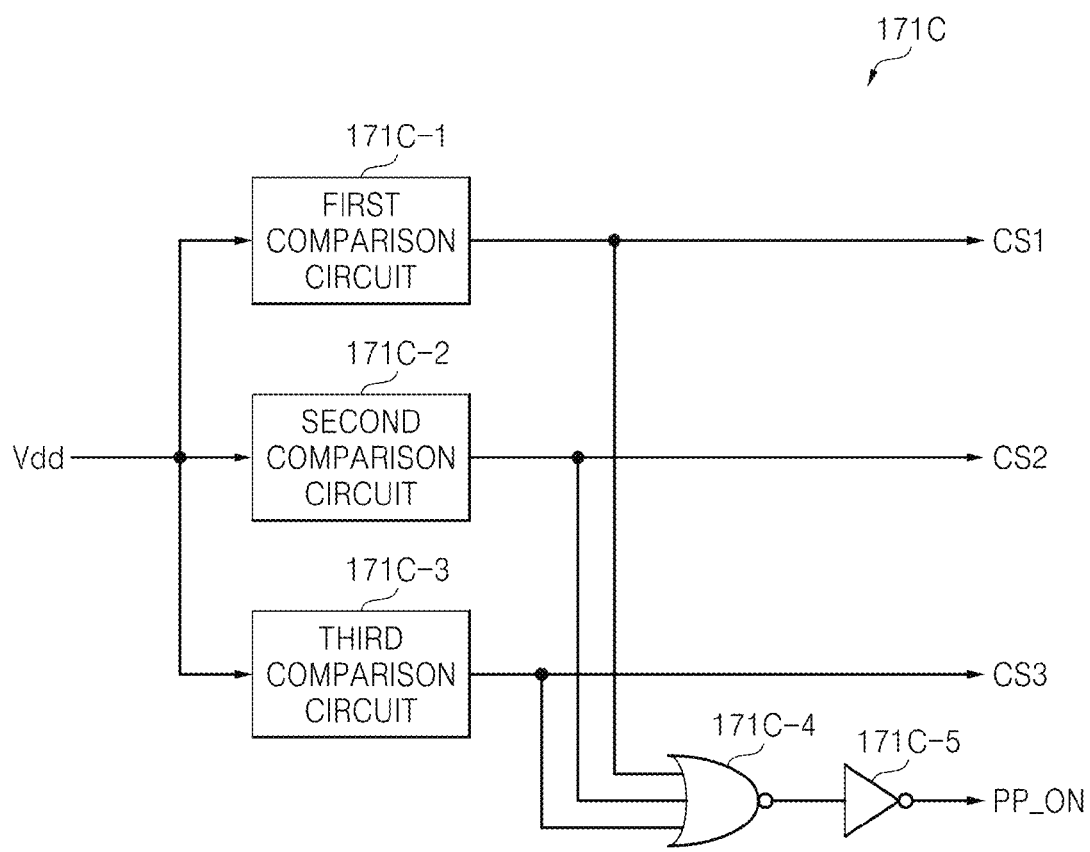
FIG. 11 is a block diagram of a control circuit illustrated in FIG. 10 according to one embodiment.

FIG. 11 is a block diagram of the control circuit 171C. Referring to FIGS. 1, 9, 10, and 11, the control circuit 171C may include a plurality of comparison circuits 171C-1, 171C-2, and 171C-3, a NOR gate 171C-4, and an inverter 171C-5.

Each of the plurality of comparison circuits 171C-1, 171C-2, or 171C-3 may compare the power supply voltage Vdd with the reference voltages having different magnitudes, respectively, and output the comparison signals CS1 through CS3, respectively, according to a result of the comparison. For example, the comparison signal CS1 is activated when the power supply voltage Vdd is lower than a first reference voltage Vref1. The comparison signals CS1 and CS2 are activated when the power supply voltage Vdd is lower than a second reference voltage Vref2, where the Vref2 is lower than the Vref1. The comparison signals CS1 through CS3 are activated when the power supply voltage Vdd is lower than a third reference voltage Vref23, where the Vref3 is lower than the Vref2. The NOR gate 171C-4 and the inverter 171C-5 output the boosting enable signal PP_ON based on the comparison signals CS1 through CS3. For example, when at least one of the comparison signals CS1 through CS3 is activated, the control circuit 171C may activate the boosting enable signal PP_ON.

The NOR gate 171C-4 and the inverter 171C-5 may be implemented by using OR gates.

The first control signal generation circuit 173C may output a first control signal LAPG based on a block enable signal BL_EN, a sense amplifier enable signal SA_EN, and the boosting enable signal PP_ON output from the control circuit 171C. The first control signal generation circuit 173C may output a first control signal LAPG for blocking the power supply voltage Vdd from the first node ND1 after supplying the power supply voltage Vdd to the first node ND1 during a precharge operation.

Figure 12:
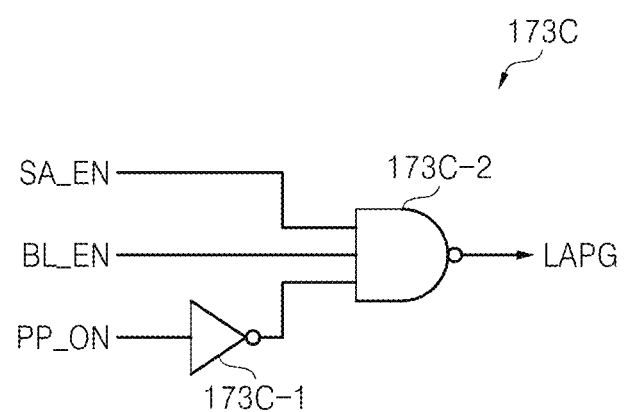
FIG. 12 is a block diagram of a first control signal generation circuit illustrated in FIG. 10 according to one embodiment.

FIG. 12 is a block diagram of the first control signal generation circuit 173C illustrated in FIG. 10. Referring to FIGS. 1 and 9-12, the first control signal generation circuit 173C may include an inverter 173C-1 and a NAND gate 173C-2.

The inverter 173C-1 may invert the boosting enable signal PP_ON output from the control circuit 171C, and the NAND gate 173C-2 may output the first control signal LAPG based on the block enable signal BL_EN, the sense amplifier enable signal SA_EN, and an output signal of the inverter 173C-1.

Figure 13:
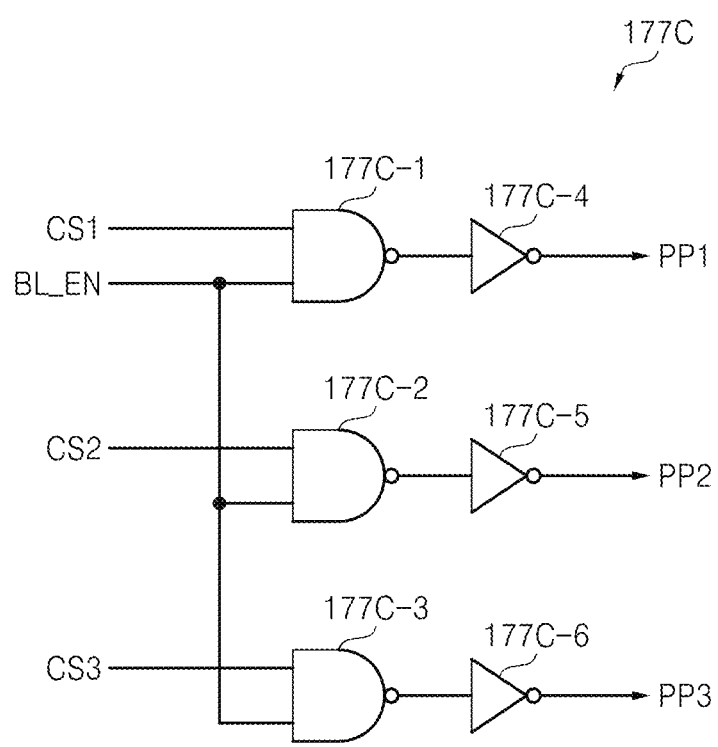
FIG. 13 is a block diagram of a third control signal generation circuit illustrated in FIG. 10 according to one embodiment.

FIG. 13 is a block diagram of the third control signal generation circuit 177C illustrated in FIG. 10. Referring to FIGS. 1 and 9-13, the third control signal generation circuit 177C may include a plurality of NAND gates 177C-1 through 177C-3 and a plurality of inverters 177C-4 through 177C-6.

The NAND gate 177C-1 and the inverter 177C-4 may perform an AND operation on the comparison signal CS1 output from the control circuit 171C and the block enable signal BL_EN and output a result of the AND operation as the third control signal PP1.

The NAND gate 177C-2 and the inverter 177C-5 may perform an AND operation on the comparison signal CS2 output from the control circuit 171C and the block enable signal BL_EN and output a result of the AND operation as the third control signal PP2. The NAND gate 177C-3 and the inverter 177C-6 may perform an AND operation on the comparison signal CS3 output from the control circuit 171C and the block enable signal BL_EN and output a result of the AND operation as the third control signal PP3.

Figure 14:
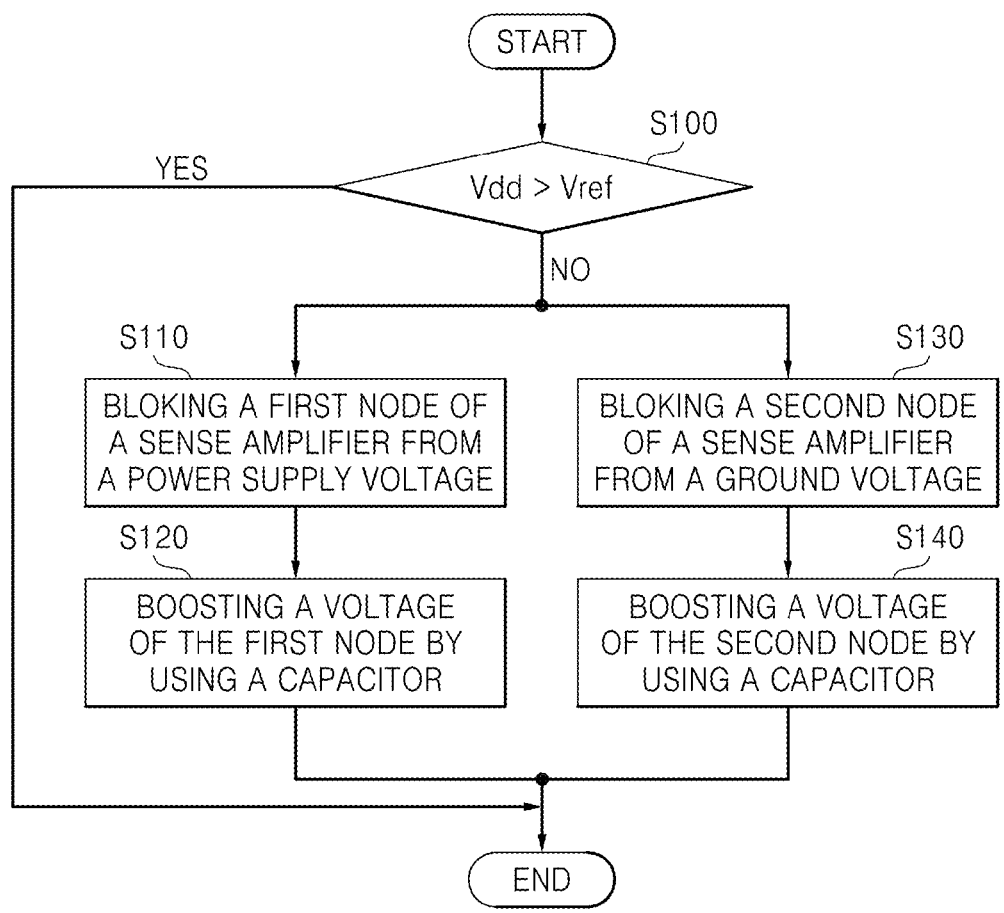
FIG. 14 is a flowchart of a method of operating a semiconductor device, according to one embodiment.

FIG. 14 is a flowchart of a method for a precharge operation of the semiconductor device 100, according to one embodiment. For convenience of explanation for a precharge operation, FIG. 14 illustrates a precharge operation for at least one cell. Referring to FIG. 14, the semiconductor devices 100-1 through 100-4 of the semiconductor device 100, may start a precharge operation at a predetermined time point after receiving a precharge command and compare the power supply voltage Vdd with at least one reference voltage Vref, in operation S100.

In one embodiment, when the power supply voltage Vdd is lower than the reference voltage Vref, the semiconductor device 100 blocks the power supply voltage Vdd from the first node ND1 of the sense amplifier 130-1 in operation S110.

The semiconductor device 100 boosts a voltage of the first node toward positive voltage by using a capacitor, in operation S120.

For example, when the first node ND1 is blocked from power supply voltage Vdd, the semiconductor device 100 may boost the first node ND1 by outputting the third control signal PP to the first boosting circuit 132, for example, a capacitor. In some cases, the capacitor may be implemented by using a MOS transistor that includes a gate via which the third control signal PP is received and a source and a drain connected to the first node ND1.

In another embodiment, when the power supply voltage Vdd is lower than the reference voltage Vref, the semiconductor device 100 blocks the ground voltage Vss from the second node ND2 of the sense amplifier 130-1 in operation S130.

The semiconductor device 100 boosts a voltage of the second node toward negative voltage by using a capacitor, in operation S140.

For example, when the second node ND2 is blocked from the ground voltage Vss, the semiconductor device 100 may boost the second node ND2 by outputting the fourth control signal PPB to the second boosting circuit 133, for example, a capacitor. In some cases, the capacitor may be implemented by using a MOS transistor that includes a gate via which the fourth control signal PPB is received and a source and a drain connected to the second node ND2.

Figure 15:
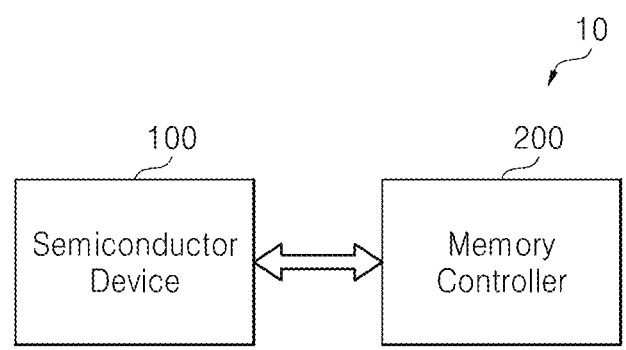
FIG. 15 is a block diagram of a processor including the semiconductor device of FIG. 1 according to one embodiment.

FIG. 15 is a block diagram of a processor 10 including the semiconductor device 100 of FIG. 1 according to one embodiment. Referring to FIG. 15, the processor 10 may include the semiconductor device 100 and a memory controller 200. The memory controller 200 may control the operation of the semiconductor device 100.

Figure 16:
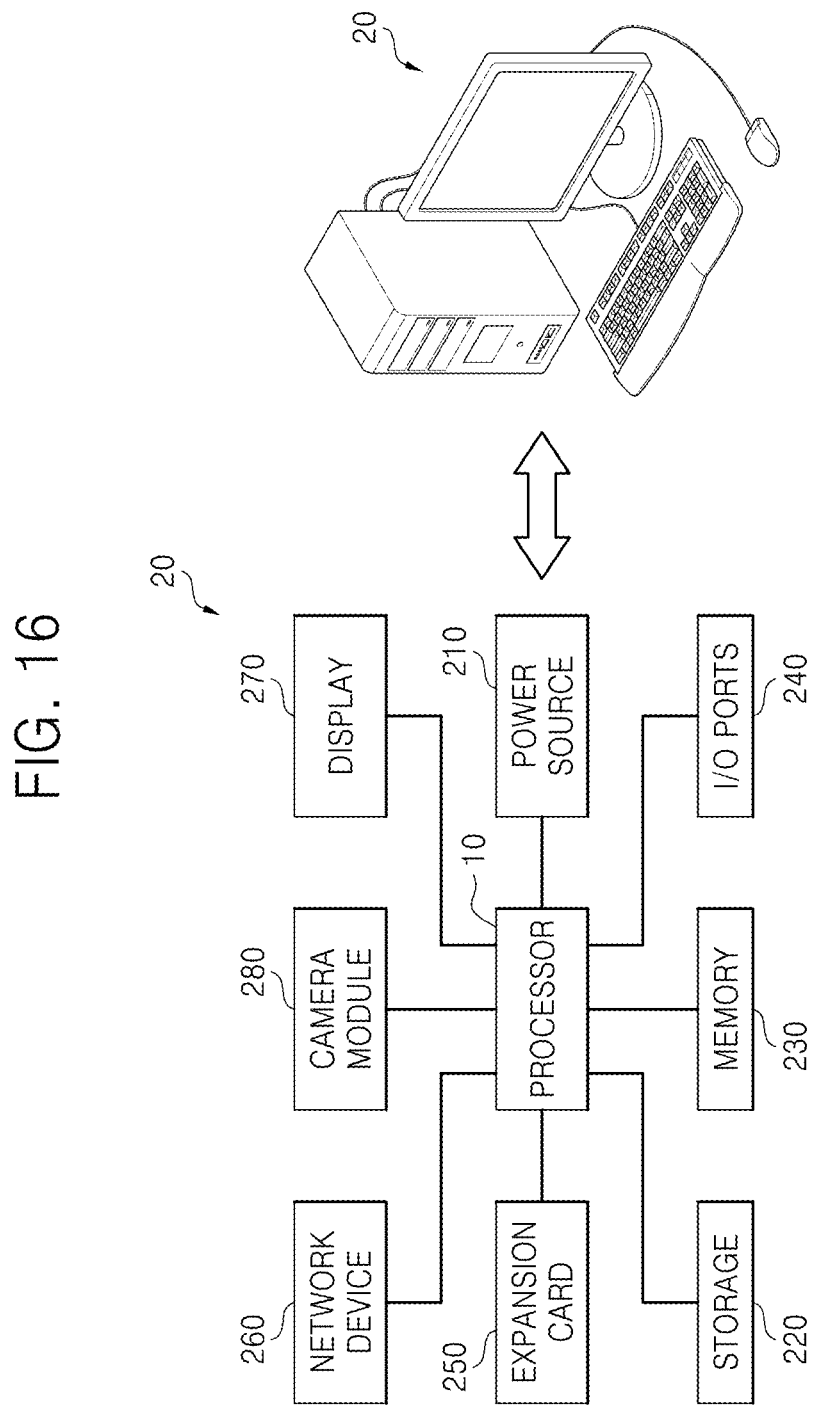
FIG. 16 is a block diagram of a data processing device including the processor illustrated in FIG. 15, according to one embodiment.

FIG. 16 is a block diagram of a data processing device 20 including the processor 10 illustrated in FIG. 15, according to one embodiment. Referring to FIG. 16, the data processing device 20 may be implemented by using a personal computer (PC) or a data server.

The data processing device 20 includes the processor 10, a power source 210, a storage device 220, a memory 230, input/output (I/O) ports 240, an expansion card 250, a network device 260, and a display 270. For example, the data processing device 20 may further include a camera module 280.

The processor 10 may control the operation of at least one of the elements 10 and 210-280. The power source 210 may supply an operational voltage to at least one of the elements 10 and 210-280. The storage device 220 may be implemented by using a hard disk drive or a solid state drive (SSD).

The memory 230 may be implemented by using a volatile memory or a non-volatile memory. According to an embodiment, a memory controller capable of controlling a data access operation, for example, a read operation, a write operation (or a program operation), or an erase operation, with respect to the memory 230 may be integrated into or embedded in the processor 10. For example, the main controller may be installed between the processor 10 and the memory 230.

The I/O ports 240 denote ports capable of transmitting data to the data processing device 20 or data output from the data processing device 20 to an external device. For example, the I/O ports 240 may be a port for connecting a pointing device, such as a computer mouse, to the data processing device 20, a port for connecting a printer to the data processing device 20, and a port for connecting a USB drive to the data processing device 20.

The expansion card 250 may be implemented by using a secure digital (SD) card or a multimedia card (MMC). In some cases, the expansion card 250 may be a Subscriber Identification Module (SIM) card or a Universal Subscriber Identity Module (USIM) card.

The network device 260 denotes a device capable of connecting the data processing device 20 to a wired or wireless network. The display 270 may display data output from the storage device 220, the memory 230, the I/O ports 240, the expansion card 250, or the network device 260.

The camera module 280 denotes a module capable of converting an optical image into an electrical image. Accordingly, an electrical image output from the camera module 280 may be stored in the storage device 220, the memory 230, or the expansion card 250. The electrical image output from the camera module 280 may be displayed on the display 270.

Figure 17:
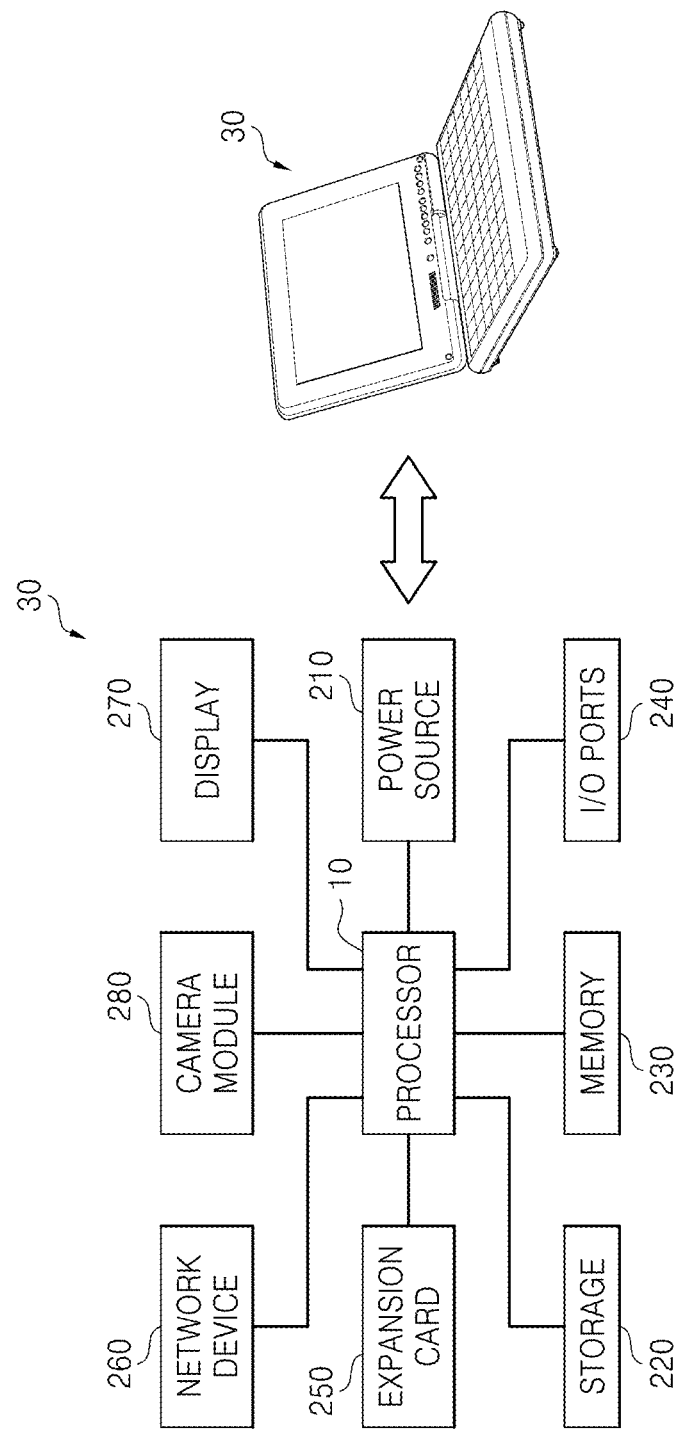
FIG. 17 is a block diagram of a data processing device including the processor illustrated in FIG. 15, according to another embodiment.

FIG. 17 is a block diagram of a data processing device 30 including the processor 10 illustrated in FIG. 15, according to another embodiment. Referring to FIG. 17, the data processing device 30 may be implemented by using a laptop computer.

Figure 18:
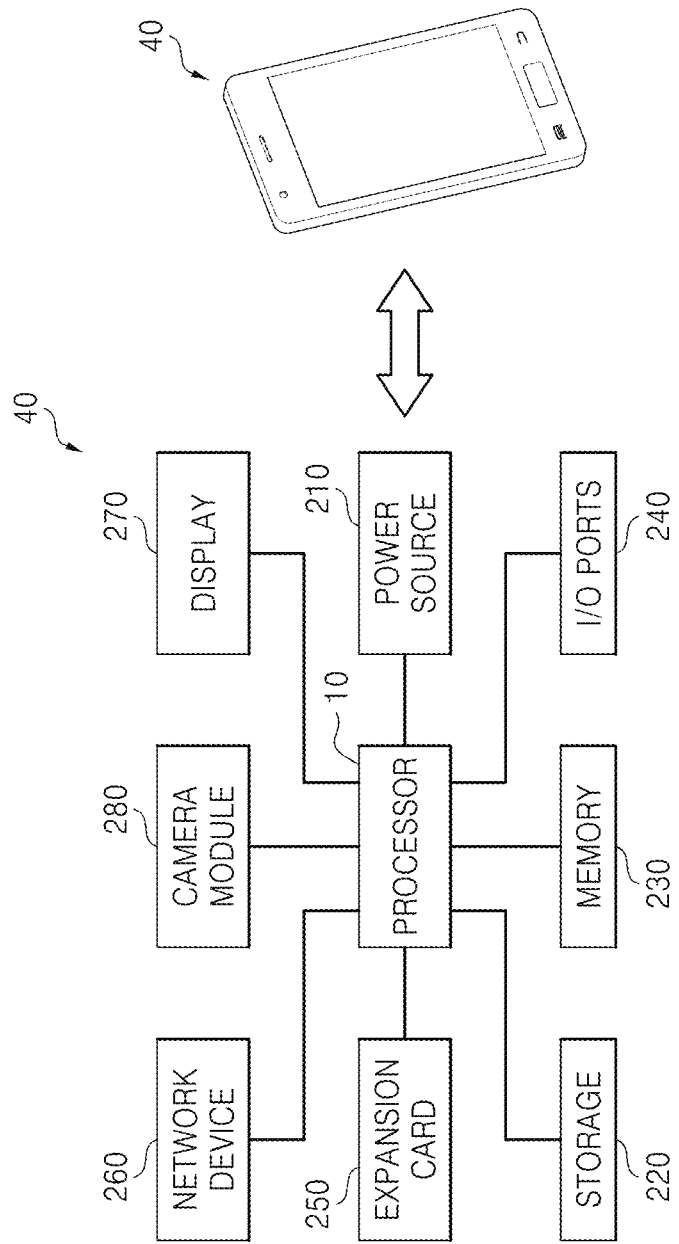
FIG. 18 is a block diagram of a data processing device including the processor illustrated in FIG. 15, according to another embodiment.

FIG. 18 is a block diagram of a data processing device 40 including the processor 10 illustrated in FIG. 15, according to another embodiment. The data processing device 40 may be implemented by using a portable device. The portable device 40 may be implemented by using a mobile phone, a smart phone, a tablet PC, a personal digital assistant (PDA), an enterprise digital assistant (EDA), a digital still camera, a digital video camera, a portable multimedia player (PMP), a personal (or portable) navigation device (PND), a handheld game console, or an e-book.

Figure 19:
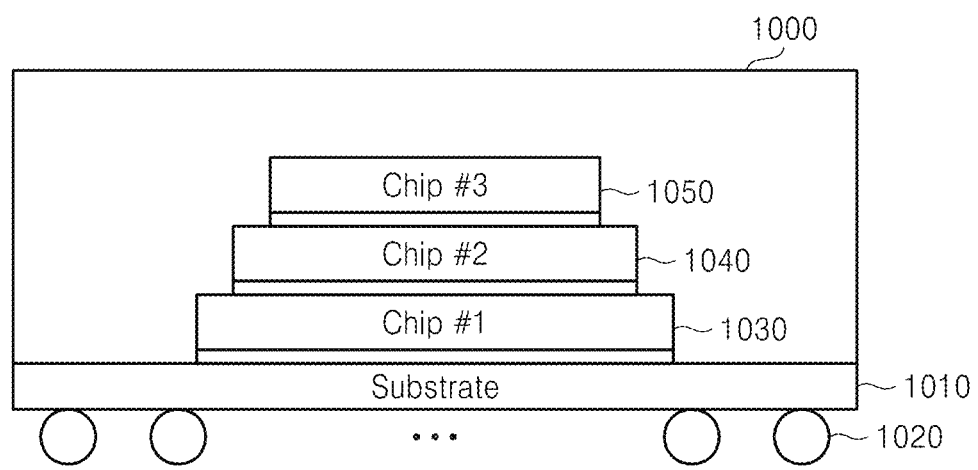
FIG. 19 is a conceptual diagram schematically illustrating a multi-chip package including the semiconductor device illustrated in FIG. 1, according to one embodiment.

FIG. 19 is a conceptual diagram schematically illustrating a multi-chip package 1000 including the semiconductor device 100 illustrated in FIG. 1, according to one embodiment. Referring to FIG. 19, the multi-chip package 1000 may include a plurality of semiconductor devices 1030 through 1050 (Chip #1 through Chip #3) sequentially stacked on a package substrate 1010. Each of the semiconductor devices 1030 through 1050 may be the semiconductor device 100. The memory controller 200 may be installed within at least one of the semiconductor devices 1030 through 1050 or may be installed on the package substrate 1010. For electrical connection between the semiconductor devices 1030 through 1050, through-substrate-vias or through-silicon-vias (TSVs) (not shown), connection lines (not shown), bumps (not shown), solder balls 1020, or the like may be used.

The multi-chip package 1000 may be implemented by using a Hybrid Memory Cube (HMC) with a stacked structure of a memory controller and a memory cell array die. The implementation by using the HMC may improve the performance of a memory device due to an increase in bandwidth and minimize an area occupied by the memory device, thereby reducing power consumption and production costs.

Figure 20:
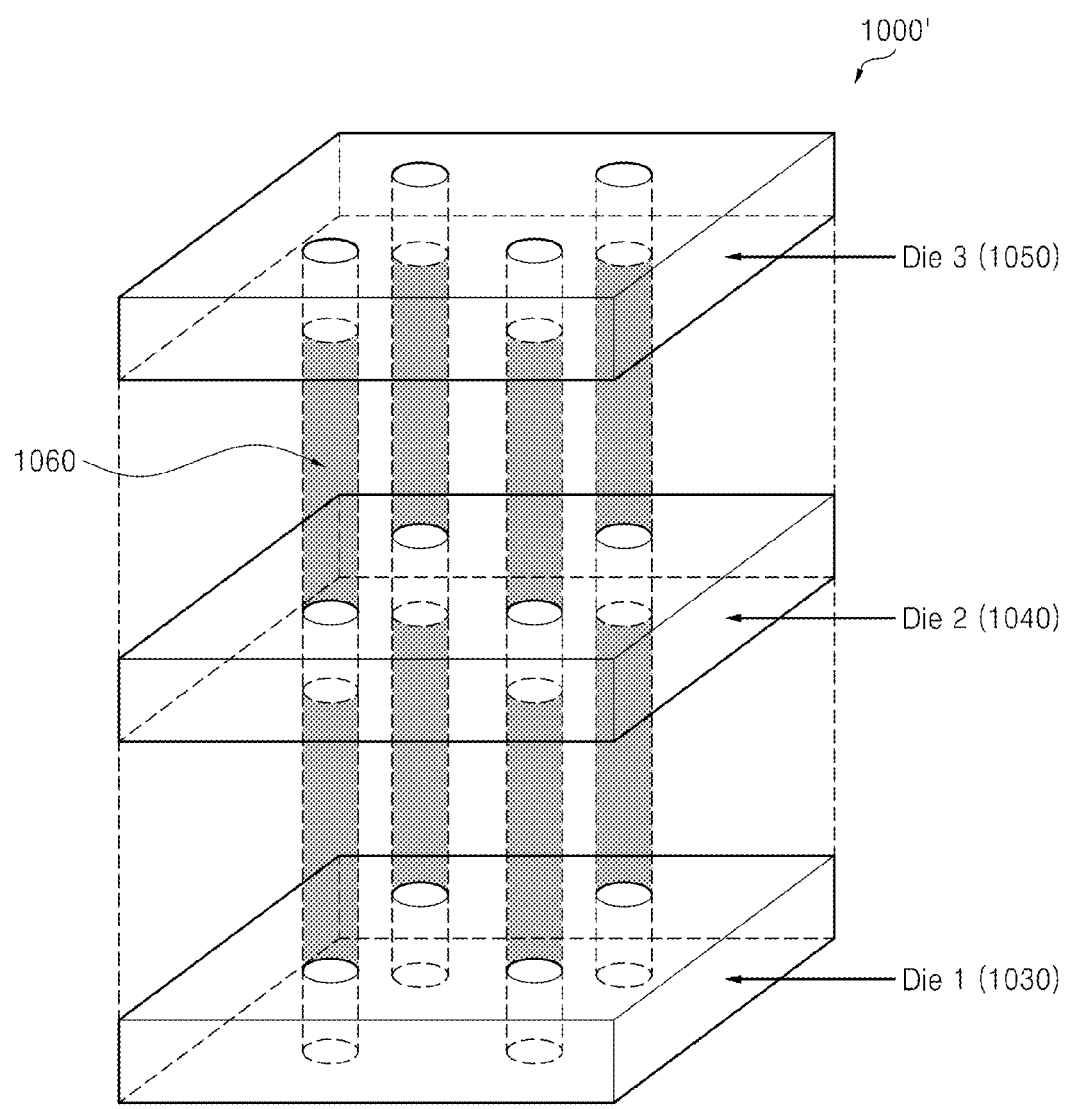
FIG. 20 is a conceptual diagram three-dimensionally illustrating a multi-chip package including the semiconductor device illustrated in FIG. 19, according to one embodiment.

FIG. 20 is a conceptual diagram three-dimensionally illustrating a multi-chip package 1000' including the semiconductor devices 1030 through 1050 illustrated in FIG. 19, according to one embodiment. Referring to FIG. 20, the multi-chip package 1000' may include a plurality of dies Die1 through Die3, the semiconductor devices 1030 through 1050, which are sequentially stacked one on another and connected to one another via TSVs 1060. Each of the dies Die1 through Die3, the semiconductor devices 1030 through 1050, may include a plurality of circuit blocks (not shown) and a periphery circuit for implementing the function of the semiconductor device 100.

The TSVs 1060 may be formed of a conductive material including a metal such as copper (Cu) and may be disposed at the center of a silicon substrate. The silicon substrate surrounds the TSVs 1060. An insulation region (not shown) may exist between the TSVs 1060 and the silicon substrate.

In a semiconductor device and a method of operating the same, according to one or more embodiments, when a power supply voltage is lower than a predetermined voltage, data stored in memory cells may be fast and stably read due to an increase in a difference between levels of a bit line and a complementary bit line during a precharge operation. Moreover, the memory cells may be restored at a voltage that is higher than the power supply voltage.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor device comprising:
a plurality of memory cells each connected to a bit line or a complementary bit line;
a sense amplifier connected between the bit line and the complementary bit line;
a first power supply circuit positioned between a power supply voltage and a first node of the sense amplifier, and configured to select between supplying a power supply voltage to the first node and blocking the power supply voltage from the first node in response to a first control signal;
a second power supply circuit positioned between a ground voltage and a second node of the sense amplifier, and configured to select between supplying a ground voltage to the second node and blocking the ground voltage from the second node in response to a second control signal; and
at least a first boosting circuit configured to, during a precharge operation of the memory cells, boost a voltage at the first node or the second node in response to a third control signal when the power supply voltage is lower than a first predetermined voltage.

2. The semiconductor device of claim 1, wherein the first boosting circuit is configured to boost the voltage of the first node in response to the third control signal when the first power supply circuit blocks the power supply voltage from the first node.

3. The semiconductor device of claim 1, wherein the first boosting circuit is configured to boost the voltage of the second node in response to the third control signal when the second power supply circuit blocks the ground voltage from the second node.

4. The semiconductor device of claim 1, further comprising:
a first voltage comparison circuit configured to compare the power supply voltage with the first predetermined voltage and output a first comparison signal; and
a control signal generation circuit configured to, in response to the first comparison signal, change at least one of the first and second control signals from a first logic level to a second logic level opposite to the first logic level, and change the third control signal from a third logic level to a fourth logic level opposite to the third logic level.

5. The semiconductor device of claim 1, further comprising:
a control signal generation circuit configured to output the first through third control signals and configured to, when the power supply voltage is lower than the first predetermined voltage, change at least one of the first and the second control signals from a first logic level to a second logic level opposite to the first logic level, and change the third control signal from a third logic level to a fourth logic level opposite to the third logic level.

6. The semiconductor device of claim 1, wherein the first boosting circuit is a capacitor.

7. The semiconductor device of claim 1, wherein the first power supply circuit includes a PMOS transistor and the second power supply circuit includes an NMOS transistor.

8. The semiconductor device of claim 1, further comprising:

first and second voltage comparison circuits configured to compare the power supply voltage with the first predetermined voltage and a second predetermined voltage lower than the first predetermined voltage and output first and second comparison signals, respectively; and at least a second boosting circuit configured to boost the voltage of the first node or the voltage of the second node in response to a fourth control signal.

9. The semiconductor device of claim 8, further comprising:

a control signal generation circuit configured to output the third and fourth control signals and configured to, when the power supply voltage is lower than the second predetermined voltage, change from a first logic level to a second logic level opposite from the first logic level.

10. A data processing device comprising:

the semiconductor device of claim 1; and a memory controller configured to control an operation of the semiconductor device.

11. A method for a precharge operation of a semiconductor device including a plurality of memory cells, the method comprising:

performing an amplifying operation on a bit line of the memory cells by supplying a power supply voltage or a ground voltage to a first node of a sense amplifier;

beginning a precharge operation after receiving a precharge command;

comparing the power supply voltage with a predetermined voltage and outputting a comparison signal;

blocking the power supply voltage or the ground voltage from the first node in response to the comparison result indicating the power supply voltage is lower than the predetermined voltage; and boosting a voltage of the first node by using a first capacitor.

12. The method of claim 11, wherein the first node is a power supply node configured to supply the power supply voltage to the sense amplifier or a ground node configured to supply the ground voltage to the sense amplifier.

13. The method of claim 12, further comprising:

blocking the power supply voltage or the ground voltage from a second node of the sense amplifier; and boosting a voltage of the second node by using a second capacitor.

14. The method of claim 13, wherein each of the first and second capacitors is a MOS capacitor.

15. A method for a precharge operation of a semiconductor device including a bit line sense amplifier between a bit line and a complementary bit line coupled to a plurality of memory cells, the method comprising:

supplying a first power voltage to a sensing line of the bit line sense amplifier;

supplying a second power voltage to a complementary sensing line of the bit line sense amplifier;

beginning a precharge operation after receiving a precharge command;

comparing the first power supply voltage with a first predetermined voltage; and boosting the sensing line or the complementary sensing line when the first power voltage is lower than the first predetermined voltage.

16. The method of claim 15, wherein the second power voltage is a ground voltage.

17. The method of claim 15, further comprising:

generating a first comparison signal when the first power voltage is lower than the first predetermined voltage; and generating a first control signal to boost the sensing line or the complementary sensing line in response to the first comparison signal.

18. The method of claim 17, further comprising:

blocking the first power voltage to the sensing line or the second power voltage to the complementary sensing line when the first power voltage is lower than the first predetermined voltage.

19. The method of claim 15, wherein boosting the sensing line or the complementary sensing line includes boosting by a first capacitor.

20. The method of claim 19, further comprising boosting the sensing line or the complementary sensing line by a second capacitor.

* * * * *